United States Patent
Seki et al.

(10) Patent No.: US 11,358,976 B2
(45) Date of Patent: Jun. 14, 2022

(54) SURFACE TREATMENT AGENT, SURFACE TREATMENT METHOD, AND AREA SELECTIVE DEPOSITION METHOD

(71) Applicant: TOKYO OHKA KOGYO CO., LTD., Kawasaki (JP)

(72) Inventors: Kenji Seki, Kawasaki (JP); Jun Iioka, Kawasaki (JP); Takumi Namiki, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 16/927,379

(22) Filed: Jul. 13, 2020

(65) Prior Publication Data

US 2021/0017204 A1 Jan. 21, 2021

(30) Foreign Application Priority Data

Jul. 16, 2019 (JP) .............................. JP2019-131239

(51) Int. Cl.
*C07F 9/40* (2006.01)
*C23C 16/455* (2006.01)
*C23C 16/04* (2006.01)

(52) U.S. Cl.
CPC .......... *C07F 9/4006* (2013.01); *C07F 9/4021* (2013.01); *C23C 16/04* (2013.01); *C23C 16/45553* (2013.01)

(58) Field of Classification Search
CPC ................. C07F 9/4006; C07F 9/4021; C23C 16/45553; C23C 16/04

USPC ........................................................... 568/14
See application file for complete search history.

(56) References Cited

U.S. PATENT DOCUMENTS

2010/0118390 A1* 5/2010 Blair ...................... G02B 5/008
359/346

OTHER PUBLICATIONS

Wilkins et al., ChemPhysChem, 16, 1687-1694, 2015. (Year: 2015).*
Hashemi et al., "A New Resist for Area Selective Atomic and Molecular Layer Deposition on Metal-Dielectric Patterns". The Journal of Physical Chemistry C, 10957-10962, May 2, 2014.
Hashemi et al., "Self-Correcting Process for High Quality Patterning by Atomic Layer Deposition". ACS NANO vol. 9, No. 9, 8710-8717, Jul. 16, 2015.

* cited by examiner

*Primary Examiner* — Hui H Chin
(74) *Attorney, Agent, or Firm* — Knobbe Martens Olson & Bear LLP

(57) ABSTRACT

A surface treatment agent including a compound represented by the following general formula (P-1) and an acid. In the formula, $R^1$ represents a linear or branched alkyl group having 8 or more carbon atoms, a linear or branched fluorinated alkyl group having 8 or more carbon atoms, or an aromatic hydrocarbon group; $R^2$ and $R^3$ each independently represents a hydrogen atom, a linear or branched alkyl group having 8 or more carbon atoms, a linear or branched fluorinated alkyl group having 8 or more carbon atoms, or an aromatic hydrocarbon group $$R^1\text{—P}(=O)(OR^2)(OR^3) \qquad (P\text{-}1).$$

8 Claims, No Drawings

SURFACE TREATMENT AGENT, SURFACE TREATMENT METHOD, AND AREA SELECTIVE DEPOSITION METHOD

TECHNICAL FIELD

The present invention relates to a surface treatment agent, a surface treatment method, and an area selective deposition method.

Priority is claimed on Japanese Patent Application No. 2019-131239, filed Jul. 16, 2019, the entire content of which is incorporated herein by reference.

DESCRIPTION OF RELATED ART

In recent years, the trend toward higher integration and miniaturization of semiconductor devices has increased, and the miniaturization of organic patterns used as masks and the inorganic patterns produced by etching have progressed, and film thickness control at the atomic layer level is required.

An atomic layer growth method (ALD (Atomic Layer Deposition) method; hereinafter also simply referred to as "ALD method") is known as a method of forming a thin film at the atomic layer level on a substrate. It is known that the ALD method has high step coverage and film thickness controllability as compared with a general CVD (Chemical Vapor Deposition) method.

The ALD method is a thin film forming technique in which two kinds of gases containing an element constituting a film to be formed as a main component are alternately supplied onto a substrate, and a thin film is formed on an atomic layer unit on the substrate by repeating a plurality of times to obtain a desired film.

In the ALD method, self-limiting ability is utilized in which only one or few layers of raw material gas components are adsorbed on the surface of the substrate while the raw material gas is being supplied, and the excess raw material gas does not contribute to the growth.

For example, in the case of forming an $Al_2O_3$ film on a substrate, TMA (trimethyl aluminum) as a raw material gas and an oxidizing gas containing 0 are used. Alternatively, in the case of forming a nitride film on a substrate, a nitriding gas is used instead of an oxidizing gas.

In recent years, a method of selectively forming a film on the surface of a substrate using the ALD method has been attempted (see Non-Patent Literatures 1 and 2).

Therefore, there has been a demand for a substrate in which the substrate surface is area-selectively modified so that it can be suitably applied to an area selective film forming method on the substrate by the ALD method.

In the film forming method, by using the ALD method, it is expected to control the film thickness at the atomic layer level of patterning, step coverage, and miniaturization.

DOCUMENTS OF RELATED ART

Non-Patent Literature

[Non-Patent Literature 1] J. Phys. Chem. C 2014, 118, 10957-10962
[Non-Patent Literature 2] ASC NANO Vol. 9, No. 9, 9710-8717(2015)

SUMMARY OF THE INVENTION

In the methods described in Non-Patent Literatures 1 and 2, it takes a long time to modify the surface of the substrate in order to selectively modify the surface of the substrate.

In addition, in the methods described in Non-Patent Literatures 1 and 2, there is room for improvement in the contrast between areas of different materials in order to improve the area-selectivity of the substrate surface.

The present invention takes the above circumstances into consideration, with an object of providing, in a method for treating a surface including two or more regions, which is made of different materials from each other with respect to adjacent regions of the two or more regions, a surface modifier capable of selectively modifying at least one area with a good reaction rate and improving the contrast between regions of different materials, a surface modifying method, and an area selective deposition method.

For solving the above-mentioned problems, the present invention employs the following aspects.

A first aspect of the present invention is a surface treatment agent including a compound (P) represented by the following general formula (P-1) and an acid (excluding the compound (P)).

[Chemical Formula 1]

$$R^1—P(=O)(OR^2)(OR^3) \quad (P-1)$$

In the formula, $R^1$ represents a linear or branched alkyl group having 8 or more carbon atoms, a linear or branched fluorinated alkyl group having 8 or more carbon atoms, or an aromatic hydrocarbon group which may have a substituent; $R^2$ and $R^3$ each independently represents a hydrogen atom, a linear or branched alkyl group having 8 or more carbon atoms, a linear or branched fluorinated alkyl group having 8 or more carbon atoms, or an aromatic hydrocarbon group which may have a substituent.

A second aspect of the present invention is a surface treatment agent containing a compound (P) represented by the following general formula (P-1), wherein a contact angle of a surface of a copper substrate after being immersed in the surface treatment agent at 25° C. for 1 minute is 90° or more.

A third aspect of the present invention is a surface treating method including exposing a surface of a substrate to the surface treatment agent according to the first or second aspect, wherein the surface includes two or more regions, which is made of different materials from each other with respect to adjacent regions of the two or more regions, and the contact angle between the adjacent regions of the two or more regions is made different by the reaction of the compound (P) with the two or more regions.

A fourth aspect of the present invention is an area selective deposition method, including: treating a surface of a substrate by the surface treating method according to the third aspect, and forming a film on the surface of the surface-treated substrate by an atomic layer growth method, wherein the deposition amount of the material of the film is area-selectively varied.

According to the present invention, there are provided, in a method for treating a surface including two or more regions, which is made of different materials from each other with respect to adjacent regions of the two or more regions, a surface modifier capable of selectively modifying at least one area with a good reaction rate and improving the contrast between regions of different materials, a surface modifying method, and an area selective deposition method.

DETAILED DESCRIPTION OF THE INVENTION

<First Aspect: Surface Treatment Agent>

The surface treatment agent according to the first aspect of the present invention includes a compound (P) represented by the following general formula (P-1) and an acid (excluding the compound (P)).

[Chemical Formula 2]

$$R^1—P(=O)(OR^2)(OR^3) \qquad (P\text{-}1)$$

In the formula, $R^1$ represents a linear or branched alkyl group having 8 or more carbon atoms, a linear or branched fluorinated alkyl group having 8 or more carbon atoms, or an aromatic hydrocarbon group which may have a substituent; $R^2$ and $R^3$ each independently represents a hydrogen atom, a linear or branched alkyl group having 8 or more carbon atoms, a linear or branched fluorinated alkyl group having 8 or more carbon atoms, or an aromatic hydrocarbon group which may have a substituent.

Compound (P)

The compound (P) is phosphonic acid or a derivative thereof represented by general formula (P-1). In general formula (P-1), $R^1$ represents a linear or branched alkyl group having 8 or more carbon atoms, a linear or branched fluorinated alkyl group having 8 or more carbon atoms, or an aromatic hydrocarbon group which may have a substituent.

In general formula (P-1), examples of the linear or branched alkyl group having 8 or more carbon atoms represented by $R^1$ include an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, a docosyl group, and isomers of the above alkyl groups.

In general formula (P-1), examples of the linear or branched fluorinated alkyl group having 8 or more carbon atoms represented by $R^1$ include groups in which part or all of the hydrogen atoms of the aforementioned linear or branched fluorinated alkyl group having 8 or more carbon atoms have been substituted with fluorine.

In general formula (P-1), examples of the aromatic hydrocarbon group (which may have a substituent) represented by $R^1$ include a phenyl group, a naphthyl group, an anthryl group, a p-methylphenyl group, a p-tert-butylphenyl group, a p-adamantylphenyl group, a tolyl group, a xylyl group, a cumenyl group, a mesityl group, a biphenyl group, a phenanthryl group, 2,6-diethylphenyl group, and 2-methyl-6-ethyl phenyl group.

Among these examples, as $R^1$, a linear or branched fluorinated alkyl group having 8 or more carbon atoms is preferable, and a dodecyl group or an octadecyl group is preferable.

The upper limit of the number of carbon atoms is not particularly limited, but is, for example, 45 or less.

The linear or branched alkyl group having 8 or more carbon atoms, the linear or branched fluorinated alkyl group having 8 or more carbon atoms, or the aromatic hydrocarbon group which may have a substituent represented by $R^2$ or $R^3$ is the same as defined for the linear or branched alkyl group having 8 or more carbon atoms, the linear or branched fluorinated alkyl group having 8 or more carbon atoms, or the aromatic hydrocarbon group which may have a substituent represented by $R^1$.

Among these, as $R^2$ and $R^3$, a hydrogen atom is preferable.

In the present embodiment, as the compound (P), 1 kind of compound may be used, or 2 or more kinds of compounds may be used in combination.

In the surface treatment agent of the present embodiment, the amount of the compound (P) with respect to the total mass of the surface treatment agent is preferably 0.0001 to 5% by mass, more preferably 0.001 to 4% by mass, still more preferably 0.01 to 3% by mass, and still more preferably 0.03 to 3% by mass.

When the amount of the compound (P) is within the above-mentioned preferable range, in a method for treating a surface including two or more regions, which is made of different materials from each other with respect to adjacent regions of the two or more regions, in the case where at least one region contains a metal surface, the compound (P) is likely to be adsorbed on the region containing the metal surface, and the selectivity of the surface treatment agent for a region containing a metal surface may be improved.

Acid

The acid may be either an organic acid or an inorganic acid, as long as it is other than the compound (P).

Examples of the organic acid include carboxylic acids such as formic acid, acetic acid, citric acid, oxalic acid, 2-nitrophenylacetic acid, 2-ethylhexanoic acid, dodecanoic acid, and 2-hydroxy-1,2,3-propanetricarboxylic acid; sugar acids such as ascorbic acid, tartaric acid and glucuronic acid; and sulfonic acids such as benzenesulfonic acid and p-toluenesulfonic acid.

Examples of the inorganic acid include hydrofluoric acid (HF), phosphonic acid ($HP(=O)(OH)_2$), phosphoric acid ($H_3PO_4$), hydrochloric acid, nitric acid, and boric acid.

Among these examples, as the acid, a carboxylic acid or an inorganic acid is preferable, acetic acid, 2-hydroxy-1,2,3-propanetricarboxylic acid, phosphonic acid ($HP(=O)(OH)_2$) or hydrofluoric acid (HF) is more preferable, phosphonic acid ($HP(=O)(OH)_2$) or hydrofluoric acid (HF) is still more preferable, and hydrofluoric acid is most preferable.

In the present embodiment, as the acid, 1 kind of compound may be used, or 2 or more kinds of compounds may be used in combination.

In the surface treatment agent of the present embodiment, the amount of the acid with respect to the total mass of the surface treatment agent is preferably 0.0005 to 0.5% by mass, more preferably 0.0006 to 0.4% by mass, still more preferably 0.0007 to 0.3% by mass, and most preferably 0.0015 to 0.2% by mass.

When the amount of the acid is within the above-mentioned preferable range, an oxide film formed on the surface of the substrate to which the surface treatment agent is applied may be reliably removed. Therefore, in a method for treating a surface including two or more regions, which is made of different materials from each other with respect to adjacent regions of the two or more regions, in the case where at least one region contains a metal surface, the compound (P) is likely to be adsorbed on the region containing the metal surface, and the selectivity of the surface treatment agent for a region containing a metal surface may be improved.

Water

The surface treatment agent according to the present embodiment preferably contains water such that the acid functions as a proton. The water may contain trace components that are inevitably mixed. Water used for the surface treatment agent of the present embodiment is preferably purified water such as distilled water, ion-exchanged water, and ultrapure water, and ultrapure water generally used in semiconductor manufacturing is more preferable. In the surface treatment agent of the present embodiment, the amount of water is preferably 1 to 25% by mass, more preferably 3 to 20% by mass, and still more preferably 5 to 15% by mass.

When the amount of water is within the above-mentioned preferable range, the acid may reliably function as a proton, and an oxide film formed on the surface of the substrate to which the surface treatment agent is applied is may be reliably removed. Therefore, in a method for treating a surface including two or more regions, which is made of different materials from each other with respect to adjacent regions of the two or more regions, in the case where at least one region contains a metal surface, the compound (P) is likely to be adsorbed on the region containing the metal surface, and the selectivity of the surface treatment agent for a region containing a metal surface may be improved.

Solvent

In the present embodiment, the surface treatment agent is preferably obtained by dissolving each component in a solvent. When the surface treatment agent contains a solvent, the surface treatment of the substrate by the dipping method, the spin coating method or the like may be reliably performed.

Specific examples of the solvent include sulfoxides such as dimethyl sulfoxide; sulfones such as dimethyl sulfone, diethyl sulfone, bis(2-hydroxyethyl) sulfone and tetramethylene sulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones such as 1,3-dimethyl-2-imidazolidinone, 1,3-diethyl-2-imidazolidinone and 1,3-diisopropyl-2-imidazolidinone; dialkyl glycol ethers such as dimethyl glycol, dimethyl diglycol, dimethyl triglycol, methyl ethyl diglycol, diethyl glycol, and triethylene glycol butyl methyl ether; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, 3-methyl-3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol sec-bundecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol and cresol; (poly)alkyleneglycol monoalkylethers such as ethylene glycol monomethyl ether, ethylene glycol monoethyl ether, ethylene glycol mono-n-propyl ether, ethylene glycol mono-n-butyl ether, diethylene glycol monomethyl ether, and diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, propylene glycol monomethyl ether acetate, and propylene glycol monoethyl ether acetate; other ethers such as dimethyl ether, diethyl ether, methyl ethyl ether, dipropyl ether, diisopropyl ether, dibutyl ether, diisoamyl ether, diethylene glycol dimethyl ether, diethylene glycol methyl ethyl ether, diethylene glycol diethyl ether, tetraethylene glycol dimethyl ether, and tetrahydrofuran; ketones such as methyl ethyl ketone, cyclohexanone, 2-heptanone, and 3-heptanone; lactic acid alkyl esters such as methyl 2-hydroxypropionate and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxy-1-butylacetate, 3-methyl-3-methoxybutyl propionate, ethyl acetate, n-propyl acetate, i-propyl acetate, n-butyl acetate, i-butyl acetate, n-pentyl acetate, n-hexyl acetate, n-heptyl acetate, n-octyl acetate, n-pentyl formate, i-pentyl acetate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, and propylene glycol diacetate; lactones such as propyrolactone, γ-butyrolactone, and 6-pentyrolactone; linear, branched or cyclic aliphatic hydrocarbons such as n-hexane, n-heptane, n-octane, n-nonane, methyloctane, n-decane, n-undecane, n-dodecane, 2,2,4,6,6-pentamethylheptane, 2,2,4,4,6,8,8-heptamethylnonane, cyclohexane, and methylcyclohexane; aromatic hydrocarbons such as benzene, toluene, xylene, 1,3,5-trimethylbenzene, and naphthalene; and terpenes such as p-menthane, diphenylmenthane, limonene, terpinene, bornane, norbornane and pinane.

Among these examples, as the solvent, 3-methyl-3-methoxy-1-butyl acetate, ethyl acetate, propylene glycol monomethyl ether acetate, propylene glycol monomethyl ether, diethylene glycol monomethyl ether, isopropanol or methyl ethyl ketone is preferable, and propylene glycol monomethyl ether is more preferable.

The surface treatment agent according to the present embodiment is preferably used in a method for treating a surface including two or more regions, which is made of different materials from each other with respect to adjacent regions of the two or more regions.

In such a case, at least one region of the two or more regions preferably contains a metal surface.

Since the surface treatment agent according to the present embodiment has a high selectivity particularly to a region including a metal surface, it can be suitably applied to an area-selective deposition method to form a film on the substrate surface using the ALD method. More specifically, the surface treatment agent according to the present embodiment may be a self-assembled monolayer (SAM) forming material which can be suitably applied to an area-selective deposition method to form a film on the substrate surface using the ALD method.

<Second Aspect: Surface Treatment Agent>

The surface treatment agent according to the second aspect of the present invention includes a compound (P) represented by the aforementioned general formula (P-1).

In the present embodiment, the compound (P) is the same as defined for the compound (P) in the surface treatment agent according to the first aspect.

A contact angle of a surface of a copper substrate after being immersed in the surface treatment agent according to the present embodiment at 25° C. for 1 minute is 90° or more. Therefore, the surface treatment agent according to the present embodiment may be suitably applied to the area-selective deposition method to form a film on a surface of a substrate containing copper using the ALD method. With respect to the surface treatment agent according to the present embodiment, a contact angle of a surface of a copper substrate after being immersed in the surface treatment agent at 25° C. for 1 minute is preferably 92° or more, and still more preferably 95° or more.

The upper limit of the above contact angle is not particularly limited, and is, for example, 135° or less.

The surface treatment agent according to the present embodiment is preferably used in a method for treating a surface including two or more regions, which is made of different materials from each other with respect to adjacent regions of the two or more regions.

In such a case, it is preferable that at least one region of the two or more regions contains a metal surface, and it is more preferable that the metal surface contains copper and/or cobalt.

More specifically, the surface treatment agent according to the present embodiment may be a self-assembled monolayer (SAM) forming material which can be suitably applied to an area-selective deposition method to form a film on the substrate surface using the ALD method.

<Third Aspect: Surface Treating Method>

A third aspect of the present invention is a surface treating method including exposing a surface of a substrate to the surface treatment agent according to the first or second aspect. In the surface treating method according to the present embodiment, the surface includes two or more regions, which is made of different materials from each other with respect to adjacent regions of the two or more regions, and the contact angle between the adjacent regions of the two or more regions is made different by the reaction of the compound (P) with the two or more regions.

In the present embodiment, examples of the "substrate" to be subjected to the surface treatment include a substrate used for manufacturing a semiconductor device. Examples of the substrate include a silicon (Si) substrate, a silicon nitride (SiN) substrate, a silicon oxide film (Ox) substrate, a tungsten (W) substrate, a cobalt (Co) substrate, a titanium nitride (TiN) substrate, a tantalum nitride (TaN) substrate, a germanium (Ge) substrate, a silicon germanium (SiGe) substrate, an aluminum (Al) substrate, a nickel (Ni) substrate, a ruthenium (Ru) substrate, and a copper (Cu) substrate.

The "surface of the substrate" includes not only the surface of the substrate itself but also the surface of the inorganic pattern and the organic pattern provided on the substrate, and the surface of the unpatterned inorganic layer or organic layer.

Examples of the inorganic pattern provided on the substrate include a pattern formed by etching a mask on the surface of the inorganic layer existing on the substrate by a photoresist method, and then performing an etching process. Examples of the inorganic layer include the substrate itself, an oxide film of an element constituting the substrate, a film or a layer of an organic substance such as SiN, Ox, W, Co, TiN, TaN, Ge, SiGe, Al, $Al_2O_3$, Ni, Ru or Cu.

The film or layer is not particularly limited, but an inorganic film or layer formed in the process of manufacturing a semiconductor device may be exemplified.

Examples of the organic pattern provided on the substrate include a resin pattern formed on the substrate by a photolithography method using a photoresist or the like. Such an organic pattern may be formed, for example, by forming an organic layer, which is a photoresist film, on a substrate, exposing the organic layer through a photomask, and developing. The organic layer may be the surface of the substrate itself or an organic layer provided on the surface of the laminated film provided on the surface of the substrate. Such an organic layer is not particularly limited, but an organic film provided for etching and forming a mask in the process of manufacturing a semiconductor device may be exemplified.

(Embodiment in which the Substrate Surface Includes Two Regions)

In the surface treating method according to the third aspect, the substrate surface includes two or more regions, which is made of different materials from each other with respect to adjacent regions of the two or more regions.

Examples of the region having a tendency of exhibiting a water contact angle higher (preferably a surface free energy lower) than the other region of the two or more regions include a region containing at least one member selected from the group consisting of W, Co, Al, $Al_2O_3$, Ni, Ru, Cu, TiN and TaN.

Examples of the region having a tendency of exhibiting a water contact angle lower (preferably a surface free energy higher) than the other region of the two or more regions include a region containing at least one member selected from the group consisting of Si, $Al_2O_3$, SiN, Ox, TiN, TaN, Ge and SiGe.

For example, in the case where one region of the two or more regions is defined as a first region, and the adjacent region is defined as a second region, the first region and the second region are made of different materials from each other.

Here, each of the first region and the second region may or may not be divided into a plurality of regions.

Examples of the first region and the second region include an embodiment in which the surface of the substrate itself is defined as the first region, and the surface of an inorganic layer formed on the surface of the substrate is defined as the second region; and an embodiment in which the surface of a first inorganic layer formed on the surface of the substrate is defined as the first region, and the surface of a second inorganic layer formed on the surface of the substrate is defined as the second region. In addition, in other embodiments in which an organic layer is formed instead of an inorganic layer, the same as above may be applied.

In an embodiment in which the surface of the substrate itself is defined as the first region, and the surface of an inorganic layer formed on the surface of the substrate is defined as the second region, in view of selectively enhancing the hydrophobicity and increasing the difference in water angles between the two or more mutually adjacent regions made of different materials from each other on the surface of the substrate, it is preferable that the first region is a surface of at least one substrate selected form the group consisting of an Si substrate, an SiN substrate, an Ox substrate, a TiN substrate, a TaN substrate, a Ge substrate and an SiGe substrate, and a surface of an inorganic layer containing at least one member selected from the group consisting of W, Co, Al, Ni, Ru, Cu, TiN and TaN formed on the surface of the substrate.

Further, in an embodiment in which the surface of a first inorganic layer formed on the surface of the substrate is defined as the first region, and the surface of a second inorganic layer formed on the surface of the substrate is defined as the second region, in view of selectively enhancing the hydrophobicity and increasing the difference in water angles between the two or more mutually adjacent regions made of different materials from each other on the surface of the substrate, it is preferable that the first region is a surface of a first organic layer containing at least one member selected from the group consisting of SiN, Ox, TiN, TaN, Ge and SiGe formed on the surface of an arbitrary substrate (e.g., an Si substrate), and the second region is a surface of a second organic layer containing at least one member selected from the group consisting of W, Co, Al, Ni, Ru, Cu, TiN and TaN formed on the surface of the substrate.

(Embodiment in which the Substrate Surface Includes Three or More Regions)

In the case where one region of the two or more regions is defined as a first region, a region adjacent to the first region is defined as a second region, and a region adjacent to the second region is defined as a third region, the first region and the second region are made of different materials from each other, and the second region and the third region are made of different materials from each other In the case where the first region and the third region are mutually adjacent, the first region and the third region are made of different materials from each other.

In the case where the first region and the third region are not mutually adjacent, the first region and the third region may or may not be made of different materials from each other.

Further, each of the first region, the second region and the third region may or may not be divided into a plurality of regions.

Examples of the first region, the second region and the third region include an embodiment in which the surface of the substrate itself is defined as the first region, the surface of a first inorganic layer formed on the surface of the substrate is defined as the second region, and the surface of a second inorganic layer formed on the surface of the substrate is defined as the third region. In addition, in other embodiments in which an organic layer is formed instead of an inorganic layer, the same as above may be applied. Further, an embodiment in which one of the second inorganic layer and the third organic layer is replaced with an organic layer so as to include both an inorganic layer and an organic layer may also be mentioned.

In view of selectively enhancing the hydrophobicity and increasing the difference in water angles between the two or more mutually adjacent regions made of different materials from each other on the surface of the substrate, it is preferable that the first region is the surface of an arbitrary substrate itself (e.g., an Si substrate), the second region is a surface of a first organic layer containing at least one member selected from the group consisting of SiN, Ox, TiN, TaN, Ge and SiGe formed on the surface of the substrate, and the third region is a surface of a second organic layer containing at least one member selected from the group consisting of W, Co, Al, Ni, Ru, Cu, TiN and TaN formed on the surface of the substrate.

The same idea can be applied to the case where a fourth or more regions are present.

The upper limit of the number of regions having different materials is not particularly limited as long as the effect of the present invention is not impaired, but is, for example, 7 or less, or 6 or less, and typically 5 or less.

(Exposure)

As a method of exposing the surface of the substrate to the surface treatment agent, a method in which a surface treatment agent which may contain a solvent (typically a liquid surface treatment agent) is applied to (e.g., coated on) the surface of the substrate, for example, by a dipping method, or a coating method such as a spin coating method, a roll coating method or a doctor blade method may be mentioned.

The exposure temperature is, for example, 10° C. or higher and 90° C. or lower, preferably 20° C. or higher and 80° C. or lower, more preferably 20° C. or higher and 70° C. or lower, and still more preferably 20° C. or higher and 30° C. or lower. The exposure time is preferably 20 seconds or longer, more preferably 30 seconds or longer, still more preferably 45 seconds or longer, from the viewpoint of selectively improving the hydrophobicity between two or more adjacent regions of different materials on the substrate surface.

The upper limit of the exposure time is not particularly limited, but is, for example, 2 hours or less, typically 1 hour or less, preferably 15 minutes or less, more preferably 5 minutes or less, and still more preferably 2 minutes or less.

After the above-mentioned exposure, washing (for example, washing with water, actinic agent rinse, etc.) and/or drying (washing with nitrogen blow etc.) may be carried out if desired.

For example, as the cleaning treatment of the surface of the substrate having the inorganic pattern or the organic pattern with the cleaning liquid, the cleaning liquid conventionally used for the cleaning treatment of the inorganic pattern or the organic pattern may be directly employed. Examples of the cleaning liquid for inorganic patterns include SPM (sulfuric acid/hydrogen peroxide solution) and APM (ammonia/hydrogen peroxide solution), and examples of the cleaning liquid for organic patterns include water and activator rinse.

Further, if desired, heat treatment at 100° C. or higher and 300° C. or lower may be additionally performed on the dried processed substrate.

By the above exposure, the compound (P) can be adsorbed region-selectively according to the material of each region on the substrate surface.

The water contact angle of the substrate surface after exposing to the surface treatment agent is, for example, 50° or more and 140° less.

By adjusting the material of the substrate surface, the kind and the amount of the compound (P) and the acid, and the exposing conditions, the water contact angle may be rendered 50° or more, preferably 60° or more, more preferably 70° or more, and still more preferably 90° or more.

The upper limit of the contact angle is not particularly limited, but is, for example, 140° or less, typically 130° or less.

In the surface treating method according to the present embodiment, by virtue of two or more adjacent regions of different materials on the substrate surface, the hydrophobicity between the two or more adjacent regions may be enhanced and difference may be made in the contact angles between the two or more adjacent regions.

The difference in the water contact angle between the two or more adjacent regions is not particularly limited as long as the effects of the present invention is not impaired, and includes, for example, 10° or more. From the viewpoint of selectively enhancing the hydrophobicity between the two or more adjacent regions, the difference in the water contact angle is preferably 20° or more, more preferably 30° or more, and still more preferably 40° or more.

The upper limit of the difference in the contact angle is not particularly limited as long as the effects of the present invention are not impaired, and is, for example, 80° or less or 70° or less, and typically 60° or less.

<Fourth Aspect: Area Selective Deposition Method on a Substrate>

Next, an area selective deposition method on a substrate using the surface treatment method according to the third aspect will be described.

In the present embodiment, the area selective deposition method includes: treating a surface of a substrate by the surface treating method according to the third aspect, and forming a film on the surface of the surface-treated substrate by an atomic layer growth method, wherein the deposition amount of the material of the film is area-selectively varied.

As a result of the surface treatment by the method according to the third aspect, the water contact angle (preferably surface free energy) between the two or more regions becomes different. Therefore, in the present aspect, the deposition amount of the material forming the film may be selectively made different on the substrate surface between the two or more regions.

Specifically, in the region where the water contact angle between the two or more regions has become larger (preferably, the surface free energy has become smaller) than that in the other region, the film forming material applied to the ALD method becomes difficult to be adsorbed (preferably chemisorption) on such region on the substrate surface. It is preferable that, as a result of the difference in the deposition amount of the film forming material between the two or more regions, the deposition amount of the film forming material is regionally selected on the substrate.

Examples of the chemical adsorption include chemical adsorption with a hydroxy group.

Examples of the region having a tendency of exhibiting a water contact angle higher (preferably a surface free energy lower) than the other region of the two or more regions include a region containing at least one member selected from the group consisting of W, Co, Al, $Al_2O_3$, Ni, Ru, Cu, TiN and TaN.

Examples of the region having a tendency of exhibiting a water contact angle lower (preferably a surface free energy higher) than the other region of the two or more regions include a region containing at least one member selected from the group consisting of Si, $Al_2O_3$, SiN, Ox, TiN, TaN, Ge and SiGe.

(Film Formation by ALD Method)

The film forming method by the ALD method is not particularly limited, but a thin film forming method by adsorption (preferably chemisorption) using at least two gas phase reactants (hereinafter simply referred to as "precursor gas") is preferable.

Specifically, there may be mentioned a method including the following steps (a) and (b) and repeating the following steps (a) and (b) at least once (1 cycle) until a desired film thickness is obtained.

(a) exposing the substrate which has been surface-treated by the method according to the third aspect to a pulse of a first precursor gas; and (b) a step of exposing the substrate to a pulse of a second precursor gas after the step (a).

After the step (a) and before the step (b), a plasma treatment step, a step of removing or purging the first precursor gas and reactants thereof with a carrier gas, a second precursor gas or the like may be included.

After the step (b), a plasma treatment step, a step of removing or purging the second precursor gas and reactants thereof with a carrier gas or the like may be included.

Examples of the carrier gas include inert gases such as nitrogen gas, argon gas and helium gas.

Each pulse for each cycle and each layer formed is preferably self-limiting, and more preferably each layer formed is a monoatomic layer.

The thickness of the monoatomic layer may be, for example, 5 nm or less, preferably 3 nm or less, more preferably 1 nm or less, and still more preferably 0.5 nm or less.

Examples of the first precursor gas include organic metals, metal halides, metal oxide halides, and the like, and specific examples thereof include tantalum pentaethoxide, tetrakis(dimethylamino)titanium, pentakis(dimethylamino)tantalum, tetrakis(dimethylamino)zirconium, tetrakis(dimethylamino)hafnium, tetrakis(dimethylamino)silane, copper hexafluoroacetylacetonate vinyltrimethylsilane, $Zn(C_2H_5)_2$, $Zn(CH_3)_2$, TMA (trimethylaluminum), $TaCl_5$, $WF_6$, $WOCl_4$, CuCl, $ZrCl_4$, $AlCl_3$, $TiCl_4$, $SiCl_4$, and $HfCl_4$.

Examples of the second precursor gas include a precursor gas capable of decomposing the first precursor and a precursor gas capable of removing the ligand of the first precursor, and specific examples thereof include $H_2O$, $H_2O_2$, $O_2O_3$, $NH_3$, $H_2S$, $H_2Se$, $PH_3$, $AsH_3$, $C_2H_4$, and $Si_2H_6$.

The exposure temperature in step (a) is not particularly limited, but is, for example, 100° C. or higher and 800° C. or lower, preferably 150° C. or higher and 650° C. or lower, more preferably 200° C. or higher and 500° C. or lower, and still more preferably 225° C. or higher and 375° C. or lower.

The exposure temperature in step (b) is not particularly limited, a temperature substantially equal to or higher than the exposure temperature in step (a) may be mentioned.

The film formed by the ALD method is not particularly limited, but a film containing a pure element (for example, Si, Cu, Ta, W), a film containing an oxide (for example, $SiO_2$, $GeO_2$, $HfO_2$, $ZrO_2$, $Ta_2O_5$, $TiO_2$, $Al_2O_3$, ZnO, $SnO_2$, $Sb_2O_5$, $B_2O_3$, $In_2O_3$, $WO_3$), a film containing a nitride (e.g., $Si_3N_4$, TiN, AlN, BN, GaN, NbN), a film containing a carbide (e.g., SiC), a film containing a sulfide (e.g., CdS, ZnS, MnS, $WS_2$, PbS), a film containing selenide (e.g., CdSe, ZnSe), a film containing phosphide (GaP, InP), a film containing arsenide (e.g., GaAs, InAs), or a mixture thereof.

EXAMPLES

As follows is a description of examples of the present invention, although the scope of the present invention is by no way limited by these examples.

Examples 1 and 2, Comparative Example 1

The components shown in Table 1 were mixed to prepare the surface treatment agent of each example.

(Surface Treatment)

Using the obtained surface treatment agents of Examples 1 and 2 and Comparative Example 1, surface treatment of $Al_2O_3$ film substrate, Cu substrate and Co substrate was performed according to the following method.

Specifically, each substrate was immersed in an HF aqueous solution having a concentration of 0.5% by mass at 25° C. for 1 minute to perform pretreatment. After the above pretreatment, the substrate was washed with ion-exchanged distilled water for 1 minute. The substrate after washing with water was dried by a nitrogen stream.

Each substrate after drying was immersed in the surface treatment agent of each example under the surface treatment conditions shown in Table 1 to perform the surface treatment of the substrate. Then, the surface-treated substrate was washed with isopropanol for 1 minute, followed by with ion-exchanged distilled water for 1 minute. The washed substrate was dried with a nitrogen stream to obtain a surface-treated substrate.

(Measurement of Water Contact Angle)

The water contact angle was measured for each surface-treated substrate.

The water contact angle was measured using Dropmaster 700 (manufactured by Kyowa Interface Science Co., Ltd.), and pure water droplets (2.0 µL) were dripped on the surface of the surface-treated substrate, and the contact angle was measured 2 seconds after the dripping. The results are shown in Table 1.

TABLE 1

| Compound | | | | Surface treatment | Contact angle (°) | | |
|---|---|---|---|---|---|---|---|
| | (P) | Acid | Water | Solvent | conditions | $Al_2O_3$ | Cu | Co |
| Comparative Example 1 | DDPA [0.05%] | — | — | PGME | 25° C., 15 min | 94.1 | 48.2 | 52.3 |
| Example 1 | DDPA [0.05%] | HF [0.1%] | DIW [10%] | PGME | 25° C., 15 min | 11.7 | 109.0 | 121.7 |
| Example 2 | DDPA [0.05%] | HF [0.1%] | DIW [10%] | PGME | 25° C., 1 min | 15.8 | 103.5 | 103.3 |

In Table 1, the reference characters indicate the following. The values in brackets [ ] indicate the amount (in terms of parts by mass) of the component added.
DDPA: dodecylphosphonic acid
HF: hydrofluoric acid
DIW: deionized water
PGME: propylene glycol monomethyl ether From the results shown in Table 1, it can be seen that the surface treatment agents of Examples 1 and 2 impart a higher contact angle to the Cu substrate and the Co substrate and a lower contact angle to the $Al_2O_3$ film substrate than the surface treatment agent of Comparative Example 1. Therefore, it can be said that the surface treatment agents of Examples 1 and 2 may be preferably applied to an area-selective film formation on the substrate surface using the ALD method.

Examples 3 and 4, Comparative Examples 2 and 3

The components shown in Table 2 were mixed to prepare the surface treatment agent of each example.
(Surface Treatment)
Using the obtained surface treatment agents of Examples 3 and 4 and Comparative Examples 2 and 3, an $SiO_2$ film substrate, an $Al_2O_3$ film substrate, a Cu substrate and a Co substrate were subjected to a surface treatment in the same manner as in Examples 1 and 2 and Comparative Example 1. The surface treatment conditions with the surface treatment agent was 25° C. for 1 minute. The results are shown in Table 2.

In Table 2, the reference characters indicate the following. The values in brackets [ ] indicate the amount (in terms of parts by mass) of the component added.
DDPA: dodecylphosphonic acid
ODPA: octadecylphosphonic acid
HF: hydrofluoric acid
DIW: deionized water
PGME: propylene glycol monomethyl ether
IBA: isobutyl alcohol From the results shown in Table 2, it can be seen that the surface treatment agents of Examples 3 and 4 impart a higher contact angle to the Cu substrate and the Co substrate and a lower contact angle to the $SiO_2$ film substrate and the $Al_2O_3$ film substrate than the surface treatment agents of Comparative Examples 2 and 3. Therefore, it can be said that the surface treatment agents of Examples 3 and 4 may be preferably applied to an area-selective film formation on the substrate surface using the ALD method.

Examples 5 to 10, Comparative Example 4

The components shown in Table 3 were mixed to prepare the surface treatment agent of each example.
(Surface Treatment)
Using the obtained surface treatment agents of Examples 5 to 10 and Comparative Example 4, an $SiO_2$ film substrate, an $Al_2O_3$ film substrate, a Cu substrate and a Co substrate were subjected to a surface treatment in the same manner as in Examples 1 and 2 and Comparative Example 1. The surface treatment conditions with the surface treatment agent was 25° C. for 1 minute. The results are shown in Table 3.

TABLE 2

| Compound | | | | | Contact angle (°) | | | |
|---|---|---|---|---|---|---|---|---|
| | (P) | Acid | Water | Solvent | $SiO_2$ | $Al_2O_3$ | Cu | Co |
| Comparative Example 2 | DDPA [0.05%] | — | — | PGME | 30.3 | 82.6 | 49.1 | 27.4 |
| Example 3 | DDPA [0.05%] | HF [0.1%] | DIW [10%] | PGME | 39.5 | 23.8 | 102.6 | 94.0 |
| Comparative Example 3 | ODPA [0.1%] | — | — | IBA | 26.8 | 92.5 | 82.8 | 26.4 |
| Example 4 | ODPA [0.05%] | HF [0.1%] | DIW [10%] | PGME | 42.5 | 22.3 | 104.5 | 117.5 |

TABLE 3

| | Compound (P) | Acid | Water | Solvent | Contact angle (°) SiO₂ | Al₂O₃ | Cu | Co |
|---|---|---|---|---|---|---|---|---|
| Comparative Example 4 | ODPA [0.1%] | — | — | IBA | 26.8 | 92.5 | 82.8 | 26.4 |
| Example 5 | ODPA [0.1%] | HF [0.1%] | DIW [10%] | IBA | 38.8 | 23.3 | 105.0 | 132.0 |
| Example 6 | ODPA [0.05%] | HF [0.1%] | DIW [10%] | IBA | 40.3 | 23.4 | 112.7 | No Data |
| Example 7 | ODPA [0.05%] | HF [0.1%] | DIW [10%] | PGME | 42.5 | 22.3 | 104.5 | 117.5 |
| Example 8 | ODPA [0.1%] | HF [0.001%] | DIW [10%] | IBA | 44.8 | 110.0 | 104.9 | 107.6 |
| Example 9 | ODPA [0.05%] | HF [0.001%] | DIW [10%] | PGME | 45.2 | 94.2 | 104.1 | 93.0 |
| Example 10 | ODPA [0.05%] | HF [0.001%] | DIW [10%] | IBA | 44.5 | 104.0 | 104.9 | 107.8 |

In Table 3, the reference characters indicate the following. The values in brackets [ ] indicate the amount (in terms of parts by mass) of the component added.
DDPA: dodecylphosphonic acid
ODPA: octadecylphosphonic acid
HF: hydrofluoric acid
DIW: deionized water
PGME: propylene glycol monomethyl ether
IBA: isobutyl alcohol From the results shown in Table 3, it can be seen that the surface treatment agents of Examples 5 to 10 impart a higher contact angle to the Cu substrate and the Co substrate than the surface treatment agent of Comparative Example 4. In particular, it can be seen that the surface treatment agents of Examples 5 to 7 also impart a low contact angle to the Al₂O₃ film. Therefore, it can be said that the surface treatment agents of Examples 5 to 10 may be preferably applied to an area-selective film formation on the substrate surface using the ALD method.

Examples 11 to 18, Comparative Examples 5 and 6

The components shown in Table 4 were mixed to prepare the surface treatment agent of each example.
(Surface Treatment)
Using the obtained surface treatment agents of Examples 11 to 18 and Comparative Examples 5 and 6, an SiO₂ film substrate, an Al₂O₃ film substrate, a Cu substrate and a Co substrate were subjected to a surface treatment in the same manner as in Examples 1 and 2 and Comparative Example 1. The results are shown in Table 4.

TABLE 4

| | Compound (P) | Acid | Water | Solvent | Surface treatment conditions | Contact angle (°) SiO₂ | Al₂O₃ | Cu | Co |
|---|---|---|---|---|---|---|---|---|---|
| Comparative Example 5 | ODPA [0.1%] | — | — | IBA | 25° C., 1 min | 26.8 | 92.5 | 82.8 | 26.4 |
| Comparative Example 6 | DDPA [0.05%] | — | — | PGME | 25° C., 15 min | — | 94.1 | 48.2 | 52.3 |
| Example 11 | ODPA [0.05%] | HF [0.001%] | DIW [10%] | PGME | 25° C., 1 min | 45.2 | 94.2 | 104.1 | 93.0 |
| Example 12 | ODPA [0.05%] | HF [0.002%] | DIW [10%] | PGME | 25° C., 1 min | 53.5 | 74.2 | 100.3 | 94.4 |
| Example 13 | ODPA [0.05%] | HF [0.003%] | DIW [10%] | PGME | 25° C., 1 min | 54.0 | 62.9 | 98.0 | 95.9 |
| Example 14 | ODPA [0.05%] | HF [0.004%] | DIW [10%] | PGME | 25° C., 1 min | 53.9 | 57.8 | 100.1 | 95.3 |
| Example 15 | ODPA [0.05%] | HF [0.005%] | DIW [10%] | PGME | 25° C., 1 min | 48.3 | 38.4 | 103.0 | 97.6 |
| Example 16 | ODPA [0.05%] | HF [0.01%] | DIW [10%] | PGME | 25° C., 1 min | 49.2 | 29.5 | 103.1 | 98.4 |
| Example 17 | ODPA [0.05%] | HF [0.05%] | DIW [10%] | PGME | 25° C., 1 min | 49.9 | 22.2 | 103.8 | 110.7 |
| Example 18 | ODPA [0.05%] | HF [0.1%] | DIW [10%] | PGME | 25° C., 1 min | 48.2 | 22.8 | 106.8 | 110.3 |

In Table 4, the reference characters indicate the following. The values in brackets [ ] indicate the amount (in terms of parts by mass) of the component added.

DDPA: dodecylphosphonic acid
ODPA: octadecylphosphonic acid
HF: hydrofluoric acid
DIW: deionized water
PGME: propylene glycol monomethyl ether
IBA: isobutyl alcohol From the results shown in Table 4, it can be seen that the surface treatment agents of Examples 11 and 18 impart a higher contact angle to the Cu substrate and the Co substrate than the surface treatment agent of Comparative Examples 5 and 6. In particular, it can be seen that the surface treatment agents of Examples 12 to 18 also impart a low contact angle to the $Al_2O_3$ film substrate. Therefore, it can be said that the surface treatment agents of Examples 11 to 18 may be preferably applied to an area-selective film formation on the substrate surface using the ALD method.

Examples 19 to 22, Comparative Examples 7 and 8

The components shown in Table 5 were mixed to prepare the surface treatment agent of each example.

(Surface Treatment)

Using the obtained surface treatment agents of Examples 19 to 22 and Comparative Examples 7 and 8, an $SiO_2$ film substrate, an $Al_2O_3$ film substrate, a Cu substrate and a Co substrate were subjected to a surface treatment in the same manner as in Examples 1 and 2 and Comparative Example 1. The results are shown in Table 5.

TABLE 5

| | Compound (P) | Acid | Water | Solvent | Surface treatment conditions | Contact angle (°) | | | |
|---|---|---|---|---|---|---|---|---|---|
| | | | | | | $SiO_2$ | $Al_2O_3$ | Cu | Co |
| Comparative Example 7 | ODPA [0.1%] | — | — | IBA | 25° C., 1 min | 26.8 | 92.5 | 82.8 | 26.4 |
| Comparative Example 8 | DDPA [0.05%] | — | — | PGME | 25° C., 15 min | — | 94.1 | 48.2 | 52.3 |
| Example 19 | ODPA [0.05%] | HF [0.1%] | DIW [10%] | PGME | 25° C., 1 min | 44.5 | 18.3 | 110.1 | 106.1 |
| Example 20 | ODPA [0.05%] | PA [0.005%] | DIW [10%] | PGME | 25° C., 1 min | 33.0 | 77.2 | 113.4 | 92.9 |
| Example 21 | ODPA [0.05%] | (A)-1 [0.1%] | DIW [10%] | PGME | 25° C., 1 min | 45.7 | 95.1 | 96.1 | 101.0 |
| Example 22 | ODPA [0.05%] | (A)-2 [0.1%] | DIW [10%] | PGME | 25° C., 1 min | 44.8 | 88.3 | 88.2 | 93.8 |

In Table 5, the reference characters indicate the following. The values in brackets [ ] indicate the amount (in terms of parts by mass) of the component added.

DDPA: dodecylphosphonic acid
OPDA: octadecylphosphonic acid
HF: hydrofluoric acid
PA: phosphonic acid
(A)-1: acetic acid
(A)-2: 2-hydroxy-1,2,3-propanetricarboxylic acid
DIW: deionized water
PGME: propylene glycol monomethyl ether
IBA: isobutyl alcohol From the results shown in Table 5, it can be seen that the surface treatment agents of Examples 19 to 22 impart a higher contact angle to the Cu substrate and the Co substrate than the surface treatment agents of Comparative Examples 7 and 8. In particular, it can be seen that the surface treatment agents of Examples 19 and 20 also impart a low contact angle to the $Al_2O_3$ film substrate. Therefore, it can be said that the surface treatment agents of Examples 19 to 22 may be preferably applied to an area-selective film formation on the substrate surface using the ALD method.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A surface treatment agent comprising:
a compound (P) represented by the following general formula (P-1),
an acid selected from the group consisting of a carboxylic acid and an inorganic acid, provided that the compound (P) is excluded, and
an organic solvent,
wherein the amount of the acid with respect to the total mass of the surface treatment agent being 0.0005 to 0.5% by mass,
wherein the surface treatment agent is used for treating a surface including two or more regions, which is made of different materials from each other with respect to adjacent regions of the two or more regions, and the adjacent regions of the two or more regions comprises at least one member selected from the group consisting of silicon, silicon nitride, silicon oxide, tungsten, cobalt, titanium nitride, tantalum nitride, germanium, silicon germanium, aluminum, nickel, ruthenium and copper:

$$R^1-P(=O)(OR^2)(OR^3) \quad (P-1)$$

wherein $R^1$ represents a linear or branched alkyl group having 8 or more carbon atoms, a linear or branched fluorinated alkyl group having 8 or more carbon atoms, or an aromatic hydrocarbon group which may have a substituent; $R^2$ and $R^3$ each independently represents a hydrogen atom, a linear or branched alkyl group having 8 or more carbon atoms, a linear or branched fluorinated alkyl group having 8 or more carbon atoms, or an aromatic hydrocarbon group which may have a substituent.

2. A surface treatment method, comprising:

exposing a surface of a substrate to the surface treatment agent according to claim 1, wherein the surface includes two or more regions, which is made of different materials from each other with respect to adjacent regions of the two or more regions, and the contact angle between the adjacent regions of the two or more regions is made different by the reaction of the compound (P) with the two or more regions.

3. An area selective deposition method, comprising:

treating a surface of a substrate by the surface treating method according to claim 2, and forming a film on the surface of the surface-treated substrate by an atomic layer growth method, wherein the deposition amount of the material of the film is area-selectively varied.

4. A surface treatment agent comprising:

a compound (P) represented by the following general formula (P-1), and an acid selected from the group consisting of a carboxylic acid, HF, $HP(=O)(OH)_2$, hydrochloric acid, nitric acid and boric acid:

$$R^1\text{—}P(=O)(OR^2)(OR^3) \quad (P\text{-}1)$$

wherein $R^1$ represents a linear or branched alkyl group having 8 or more carbon atoms, a linear or branched fluorinated alkyl group having 8 or more carbon atoms, or an aromatic hydrocarbon group which may have a substituent; $R^2$ and $R^3$ each independently represents a hydrogen atom, a linear or branched alkyl group having 8 or more carbon atoms, a linear or branched fluorinated alkyl group having 8 or more carbon atoms, or an aromatic hydrocarbon group which may have a substituent.

5. The surface treatment agent according to claim 4, wherein the acid is a carboxylic acid.

6. The surface treatment agent according to claim 4, wherein the acid selected from the group consisting of HF, $HP(=O)(OH)_2$, hydrochloric acid, nitric acid and boric acid.

7. The surface treatment agent according to claim 4, which is used for treating a surface including two or more regions, which is made of different materials from each other with respect to adjacent regions of the two or more regions.

8. The surface treatment agent according to claim 7, wherein at least one region of the two or more regions contains a metal surface.

* * * * *